(12) United States Patent
Anderson et al.

(10) Patent No.: US 8,043,732 B2
(45) Date of Patent: Oct. 25, 2011

(54) MEMORY CELL WITH RADIAL BARRIER

(75) Inventors: Paul E. Anderson, Eden Prairie, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 316 days.

(21) Appl. No.: 12/268,638

(22) Filed: Nov. 11, 2008

(65) Prior Publication Data

US 2010/0117169 A1     May 13, 2010

(51) Int. Cl.
G11B 5/39 (2006.01)
H01F 10/08 (2006.01)
H01L 43/08 (2006.01)
H01L 43/12 (2006.01)

(52) U.S. Cl. ............. 428/811.1; 428/811.5; 360/324.11; 360/324.12; 365/158; 257/421; 324/207.21

(58) Field of Classification Search ........................ None
See application file for complete search history.

(56) References Cited

U.S. PATENT DOCUMENTS

| | | | |
|---|---|---|---|
| 4,733,371 A | 3/1988 | Terada |
| 5,191,223 A | 3/1993 | Munekata |
| 5,646,419 A | 7/1997 | McCaldin |
| 5,673,225 A | 9/1997 | Jeong |
| 5,761,115 A | 6/1998 | Kozocki |
| 5,920,446 A | 7/1999 | Gill |
| 5,982,670 A | 11/1999 | Yamashita |
| 6,072,718 A | 6/2000 | Abraham |
| 6,178,136 B1 | 1/2001 | Lin |
| 6,226,197 B1 | 5/2001 | Nishimura |
| 6,252,796 B1 | 6/2001 | Lenssen |
| 6,381,106 B1 | 4/2002 | Pinarbasi |
| 6,469,926 B1 | 10/2002 | Chen |
| 6,532,164 B2 | 3/2003 | Redon |
| 6,542,000 B1 | 4/2003 | Black |
| 6,569,745 B2 | 5/2003 | Hsu |
| 6,584,016 B2 | 6/2003 | Park |
| 6,603,677 B2 | 8/2003 | Redon |
| 6,633,498 B1 | 10/2003 | Heide |
| 6,639,830 B1 | 10/2003 | Watanbe |
| 6,643,168 B2 | 11/2003 | Okazawa |
| 6,700,753 B2 | 3/2004 | Singleton |
| 6,703,645 B2 | 3/2004 | Ohno |

(Continued)

FOREIGN PATENT DOCUMENTS

GB  2 422 735  8/2006
WO  2008/100868  8/2008

OTHER PUBLICATIONS

PCT Search Report and Written Opinion dated Mar. 10, 2010.

(Continued)

*Primary Examiner* — Kevin Bernatz
(74) *Attorney, Agent, or Firm* — Campbell Nelson Whipps LLC

(57) ABSTRACT

Magnetic tunnel junction cells and methods of making magnetic tunnel junction cells that include a radially protective layer extending proximate at least the ferromagnetic free layer of the cell. The radially protective layer can be specifically chosen in thickness, deposition method, material composition, and/or extent along the cell layers to enhance the effective magnetic properties of the free layer, including the effective coercivity, effective magnetic anisotropy, effective dispersion in magnetic moment, or effective spin polarization.

21 Claims, 9 Drawing Sheets

U.S. PATENT DOCUMENTS

| | | |
|---|---|---|
| 6,711,051 B1 | 3/2004 | Poplevine |
| 6,711,067 B1 | 3/2004 | Kablanian |
| 6,714,444 B2 | 3/2004 | Huai |
| 6,741,492 B2 | 5/2004 | Nii |
| 6,744,086 B2 | 6/2004 | Daughton |
| 6,759,263 B2 | 7/2004 | Ying et al. |
| 6,765,819 B1 | 7/2004 | Bhatacharyya |
| 6,774,391 B1 | 8/2004 | Cowburn |
| 6,781,867 B2 | 8/2004 | Kurth |
| 6,781,871 B2 | 8/2004 | Park |
| 6,801,415 B2 | 10/2004 | Slaughter |
| 6,818,961 B1 | 11/2004 | Rizzo |
| 6,829,161 B2 | 12/2004 | Huai |
| 6,831,312 B2 | 12/2004 | Slaughter |
| 6,834,005 B1 | 12/2004 | Parkin |
| 6,835,423 B2 | 12/2004 | Chen |
| 6,838,740 B2 | 1/2005 | Huai |
| 6,842,368 B2 | 1/2005 | Hayakawa |
| 6,845,038 B1 | 1/2005 | Shukh |
| 6,847,547 B2 | 1/2005 | Albert |
| 6,850,433 B2 | 2/2005 | Sharma |
| 6,864,551 B2 | 3/2005 | Tsang |
| 6,888,703 B2 | 5/2005 | Dieny |
| 6,888,742 B1 | 5/2005 | Nguyen |
| 6,909,633 B2 | 6/2005 | Tsang |
| 6,914,807 B2 | 7/2005 | Nakamura |
| 6,920,063 B2 | 7/2005 | Huai |
| 6,930,910 B2 | 8/2005 | Oh |
| 6,933,155 B2 | 8/2005 | Albert |
| 6,943,040 B2 | 9/2005 | Min |
| 6,950,335 B2 | 9/2005 | Dieny |
| 6,958,927 B1 | 10/2005 | Nguyen |
| 6,963,500 B2 | 11/2005 | Tsang |
| 6,965,522 B2 | 11/2005 | Lung |
| 6,967,863 B2 | 11/2005 | Huai |
| 6,979,586 B2 | 12/2005 | Guo |
| 6,985,378 B2 | 1/2006 | Kozicki |
| 6,985,385 B2 | 1/2006 | Nguyen |
| 6,992,359 B2 | 1/2006 | Nguyen |
| 6,998,150 B2 | 2/2006 | Li |
| 7,009,877 B1 | 3/2006 | Huai |
| 7,020,024 B2 | 3/2006 | Sim |
| 7,057,921 B2 | 6/2006 | Valet |
| 7,067,330 B2 | 6/2006 | Min |
| 7,067,866 B2 | 6/2006 | Shi |
| 7,088,609 B2 | 8/2006 | Valet |
| 7,088,624 B2 | 8/2006 | Daniel |
| 7,092,279 B1 | 8/2006 | Sheppard |
| 7,093,347 B2 | 8/2006 | Nowak |
| 7,098,494 B2 | 8/2006 | Pakala |
| 7,098,495 B2 | 8/2006 | Sun |
| 7,099,186 B1 | 8/2006 | Braun |
| 7,105,372 B2 | 9/2006 | Min |
| 7,110,284 B2 | 9/2006 | Hayakawa |
| 7,110,287 B2 | 9/2006 | Huai |
| 7,126,202 B2 | 10/2006 | Huai |
| 7,138,648 B2 | 11/2006 | Kneissl |
| 7,161,829 B2 | 1/2007 | Huai |
| 7,187,577 B1 | 3/2007 | Wang |
| 7,189,435 B2 | 3/2007 | Tuominen |
| 7,190,611 B2 | 3/2007 | Nguyen |
| 7,196,882 B2 | 3/2007 | Deak |
| 7,224,601 B2 | 5/2007 | Pancula |
| 7,230,265 B2 | 6/2007 | Kaiser |
| 7,230,845 B1 | 6/2007 | Wang |
| 7,233,039 B2 | 6/2007 | Huai |
| 7,241,631 B2 | 7/2007 | Huai |
| 7,241,632 B2 * | 7/2007 | Yang .................. 438/3 |
| 7,242,045 B2 | 7/2007 | Nguyen |
| 7,242,048 B2 | 7/2007 | Huai |
| 7,245,462 B2 | 7/2007 | Huai |
| 7,272,034 B1 | 9/2007 | Chen |
| 7,272,035 B1 | 9/2007 | Chen |
| 7,274,057 B2 | 9/2007 | Worledge |
| 7,282,755 B2 | 10/2007 | Pakala |
| 7,285,836 B2 | 10/2007 | Ju |
| 7,286,395 B2 | 10/2007 | Chen |
| 7,289,356 B2 | 10/2007 | Diao |
| 7,345,912 B2 | 3/2008 | Luo |
| 7,369,427 B2 | 5/2008 | Diao |
| 7,379,327 B2 | 5/2008 | Chen |
| 7,385,842 B2 | 6/2008 | Deak |
| 7,403,418 B2 | 7/2008 | Lin |
| 7,408,806 B2 | 8/2008 | Park |
| 7,411,815 B2 | 8/2008 | Gogl |
| 7,430,135 B2 | 9/2008 | Huai |
| 7,477,491 B2 | 1/2009 | Li |
| 7,480,173 B2 | 1/2009 | Guo |
| 7,485,503 B2 | 2/2009 | Brask |
| 7,486,551 B1 | 2/2009 | Li |
| 7,486,552 B2 | 2/2009 | Apalkov |
| 7,489,541 B2 | 2/2009 | Pakala |
| 7,495,867 B2 | 2/2009 | Sbiaa |
| 7,502,249 B1 | 3/2009 | Ding |
| 7,515,457 B2 | 4/2009 | Chen |
| 7,518,835 B2 | 4/2009 | Huai |
| 7,539,047 B2 | 5/2009 | Katti |
| 7,572,645 B2 | 8/2009 | Sun |
| 7,573,736 B2 | 8/2009 | Wang |
| 7,576,956 B2 | 8/2009 | Huai |
| 7,630,177 B2 | 12/2009 | Beach |
| 7,728,622 B2 | 6/2010 | Chua-Eoan et al. |
| 7,935,435 B2 * | 5/2011 | Gao et al. .................. 428/811.1 |
| 7,939,188 B2 * | 5/2011 | Xi et al. .................... 428/811.1 |
| 2003/0011945 A1 | 1/2003 | Yuasa |
| 2003/0137864 A1 | 7/2003 | Holden |
| 2004/0008537 A1 | 1/2004 | Sharma |
| 2004/0041182 A1 * | 3/2004 | Tuttle et al. .................. 257/295 |
| 2004/0084702 A1 | 5/2004 | Jeong |
| 2004/0090809 A1 | 5/2004 | Tran |
| 2004/0170055 A1 | 9/2004 | Albert |
| 2004/0179311 A1 | 9/2004 | Li |
| 2004/0197579 A1 | 10/2004 | Chen |
| 2005/0048674 A1 | 3/2005 | Shi |
| 2005/0068684 A1 | 3/2005 | Gill |
| 2005/0117391 A1 | 6/2005 | Yoda |
| 2005/0139883 A1 | 6/2005 | Sharma |
| 2005/0150535 A1 | 7/2005 | Samavedam |
| 2005/0150537 A1 | 7/2005 | Ghoshal |
| 2005/0184839 A1 | 8/2005 | Nguyen |
| 2005/0185459 A1 | 8/2005 | Fukuzumi |
| 2005/0237787 A1 | 10/2005 | Huai |
| 2005/0269612 A1 | 12/2005 | Torok |
| 2005/0275003 A1 | 12/2005 | Shinmura |
| 2005/0282379 A1 | 12/2005 | Saito |
| 2006/0049472 A1 | 3/2006 | Diao |
| 2006/0060832 A1 | 3/2006 | Symanczyk |
| 2006/0061919 A1 | 3/2006 | Li |
| 2006/0083047 A1 | 4/2006 | Fujita |
| 2006/0141640 A1 | 6/2006 | Huai |
| 2006/0171199 A1 | 8/2006 | Ju |
| 2006/0187705 A1 * | 8/2006 | Nakamura et al. ............. 365/171 |
| 2006/0233017 A1 | 10/2006 | Hosotami |
| 2006/0245117 A1 | 11/2006 | Nowak |
| 2007/0002504 A1 | 1/2007 | Huai |
| 2007/0007609 A1 | 1/2007 | Saito |
| 2007/0008661 A1 * | 1/2007 | Min et al. .................... 360/324.1 |
| 2007/0025164 A1 | 2/2007 | Kim |
| 2007/0029630 A1 | 2/2007 | Seyyedy |
| 2007/0035890 A1 | 2/2007 | Sbiaa |
| 2007/0047294 A1 | 3/2007 | Panchula |
| 2007/0054450 A1 | 3/2007 | Hong et al. |
| 2007/0063237 A1 | 3/2007 | Huai |
| 2007/0064352 A1 | 3/2007 | Gill |
| 2007/0069314 A1 | 3/2007 | Wilson |
| 2007/0085068 A1 | 4/2007 | Apalkov |
| 2007/0096229 A1 | 5/2007 | Yoshikawa |
| 2007/0120210 A1 | 5/2007 | Yuan et al. |
| 2007/0132049 A1 | 6/2007 | Stipe |
| 2007/0164380 A1 | 7/2007 | Min |
| 2007/0171694 A1 | 7/2007 | Huai |
| 2007/0188942 A1 * | 8/2007 | Beach et al. ................ 360/324.2 |
| 2007/0230233 A1 | 10/2007 | Takahashi |
| 2007/0241392 A1 | 10/2007 | Lin |
| 2007/0246787 A1 | 10/2007 | Wang |
| 2007/0297220 A1 | 12/2007 | Yoshikawa |
| 2008/0026253 A1 | 1/2008 | Yuasa |

| | | |
|---|---|---|
| 2008/0061388 A1 | 3/2008 | Diao |
| 2008/0130354 A1 | 6/2008 | Ho |
| 2008/0179699 A1 | 7/2008 | Horng |
| 2008/0180991 A1 | 7/2008 | Wang |
| 2008/0191251 A1 | 8/2008 | Ranjan |
| 2008/0258247 A1 | 10/2008 | Mancoff |
| 2008/0265347 A1* | 10/2008 | Iwayama et al. ............... 257/421 |
| 2008/0273380 A1 | 11/2008 | Diao |
| 2008/0277703 A1 | 11/2008 | Iwayama |
| 2008/0291721 A1 | 11/2008 | Apalkov |
| 2008/0310213 A1 | 12/2008 | Chen |
| 2008/0310219 A1 | 12/2008 | Chen |
| 2009/0027810 A1 | 1/2009 | Horng |
| 2009/0040855 A1 | 2/2009 | Luo |
| 2009/0050991 A1 | 2/2009 | Nagai |
| 2009/0073756 A1 | 3/2009 | Yang |
| 2009/0147562 A1* | 6/2009 | Clinton et al. ................ 365/158 |
| 2009/0185410 A1 | 7/2009 | Huai |
| 2009/0218645 A1 | 9/2009 | Ranjan |
| 2009/0257154 A1 | 10/2009 | Carey |
| 2009/0296454 A1 | 12/2009 | Honda |
| 2009/0302403 A1 | 12/2009 | Nguyen |
| 2010/0032777 A1* | 2/2010 | Gao et al. ....................... 257/421 |
| 2010/0034009 A1 | 2/2010 | Lu |
| 2010/0053822 A1* | 3/2010 | Xi et al. ..................... 360/324.2 |
| 2010/0102406 A1* | 4/2010 | Xi et al. ......................... 257/421 |
| 2010/0118600 A1 | 5/2010 | Nagase |
| 2010/0176471 A1 | 7/2010 | Zhu |

OTHER PUBLICATIONS

Baek et al., Tech. Dig. IEDM (2004) 587.
Berger, Emission of Spin Waves by Magnetic Multilayer Traversed by a Current, Physic. Review B 54, 9353 (1996).
Black et al., Programmable Logic Using Giant Magnetoresistance and Spin-Dependent Tunneling Devices (Invited), J. Appl. Phys. 87, 6674 (2000).
Chu et al., Fabrication of Ideally Ordered Nanoporous Alumina Films and Integrated Alumina Nanotubule Arrays by High-Field Anodization, Adv. Mater. 2005, 17, 2115-2119.
Cowburn et al., Room Temperature Magnetic Quantum Cellular Automata, Science 287, 1466 (2000).
de Groot et al., New Class of Materials: Half-Metallic Ferromagnets, Physics Review Letters, 50, 2024 (1983).
Egelhoff et al., Oxygen as a Surfactant in the Growth of Giant Magnetoresistance Spin Valves, Journal of Applied Physics 82 (12), Dec. 15, 1997.
Emley, N.C., et al., Reduction of Spin Transfer by Synthetic Antiferromagnets, Applied Physics Letters, May 24, 2004, pp. 4257-4259, vol. 84, No. 21.
Folk et al., A Gate-Controlled Bidirectional Spin Filter Using Quantum Coherence, Science, vol. 299, Jan. 31, 2003, pp. 679-682.
Hayakawa et al., Current-Induced Magnetization Switching in MgO Barrier Based Magnetic Tunnel Junctions with CoFeB/Ru/CoFeB Synthetic Ferrimagnetic Free layer, Japanese Journal of Applied Physics, vol. 45, No. 40, 2006, pp. L1057-1060.
Huczko, Template-Based Synthesis of Nanomaterials, Appl. Phys. A 70, 365-376 (2000).
Kawahara et al., 2Mb Spin-Transfer Torque RAM (SPRAM) with Bit-by-Bit Bidirectional Current Write and Parallelizing-Direction Current Read, ISSCC 2007, Section 26, Non-Volatile Memories/26.5.
Korenivski, et al., Thermally Activiated Switching in Spin-Flop Tunnel Junctions, Applied Physics Letters 86, 252506 (2005).
Li et al., Role of Oxygen Exposure in Different Positions in the Synthetic Spin Valves, Journal of Applied Physics, vol. 93, No. 10, May 15, 2003.
Macak et al., High-Aspect-Ratio TiO2, Nanotubes by Anodization of Titanium, Angew. Chem. Int. Ed. 2005, 44, 2100-2102.
Masuda and Kenji Fukuda, Science, 268, 1466 91995). KMB: Duplicate of C 17, below.
Masuda et al., Ordered Metal Nanohole Arrays Made by a Two-Step Replication of Honeycomb Structures of Anodic Alumina, Science, OI.268, Jun. 9, 1995.
Meng et al., A Spintronics Full Adder for Magnetic CPU, IEEE Elec. Dev. Lett. 26, 360 (2005).
Meng et al., Spin Transfer in Nanomagnetic Devices with Perpendicular Anistropy, Applied Physics Letters 88, 172506 (2006).
Miura et al., A Novel SPRAM (Spin Transfer Torque RAM) with a Synthetic Ferrimagnetic Free Layer . . . , VLSI Symposium on VLSI Tech. Digest of Technical Papers (2007).
Ney et al., Programmable Computing with a Single Magnetoresistance Element, Nature 425, 485 (2003).
PCT Search Report and Written Opinion dated Oct. 4, 2010, Our Ref: 15010WO00.
PCT Search Report and Written Opinion dated Mar. 22, 2010, Our Ref: 14647WO00.
Prejbeanu et al., Thermally Assisted MRAM, J. Phys. Condens. Matter 19 (2007) 165218 (23 pp).
Seki et al., Spin-Polarized Current-Induced Magnetization Reversal in Perpendicularly Magnetized L1o-FePt Layers, Applied Physics Letters 88, 172504 (2006).
Sharrock, Time Dependence of Switching Fields in Magnetic Recording Media (Invited), J. Appl. Phys. 76 (10), Nov. 15, 1994.
Slonczewski et al., Current-Driven Excitation of Magnetic Multilayers, Journal of Magnetism and Magnetic Materials 159 (1996) L1-L7.
Sun, "Spin-Current Interaction with a Monodomain Magnetic Body: A Model Study", Physical Review B, vol. 62, No. 1, (2000), pp. 570-578.
Sun, Current-Driven Magnetic Switching in Manganite Trilayer Junctions, Journal of Magnetism and Magnetic Materials 202 (1999) 157-162.
Thurn-Albrecht et al., Science, 290, 2126 (2000).
U.S. Appl. No. 12/416,976, filed Apr. 2, 2009, Inventor: Zheng, Our Ref: 14630.
U.S. Appl. No. 12/106,382, filed Apr. 21, 2008, Inventors: Xi et al.
U.S. Appl. No. 12/125,975, filed May 23, 2008, Inventor: Xi, Our Ref: 13866.00.
U.S. Appl. No. 12/126,014, filed May 23, 2008, Inventor: Xiaohua Lou, Our Ref: 14204.00.
U.S. Appl. No. 12/170,519, filed Jul. 10, 2008, Inventors: Xi et al.
U.S. Appl. No. 12/175,545, filed Jul. 18, 2008, Inventor: Lou.
U.S. Appl. No. 12/239,882, filed Sep. 29, 2008, Inventor: Zheng et al.
U.S. Appl. No. 12/239,887, filed Sep. 29, 2008; Inventor: Zheng, Our Ref: 1011.14596.00.
U.S. Appl. No. 12/258,476, filed Oct. 27, 2008, Inventor: Lou.
U.S. Appl. No. 12/258,491, filed Oct. 27, 2008, Inventor: Lou.
U.S. Appl. No. 12/258,492, filed Oct. 27, 2008, Inventor: Lou.
U.S. Appl. No. 12/269,507, filed Nov. 12, 2008, Inventor: Tian.
U.S. Appl. No. 12/269,514, filed Nov. 12, 2008, Inventor: Venkatasamy.
U.S. Appl. No. 12/269,537, filed Nov. 12, 2008, Inventor: Tang et al.
U.S. Appl. No. 12/396,905, filed Mar. 3, 2009, Inventor: Gao, Our Ref: 14689.
U.S. Appl. No. 12/398,214, filed Mar. 5, 2009, Inventor: Wang et al.
U.S. Appl. No. 12/425,457, filed Apr. 17, 2009, Inventor: Gao (14787).
Vurgaftman et al., Spin-Polarizing Properties of the InAs/(AlSb)/GaMnSb/(AlSb/InAs Ferromagnetic Resonant Interband Tunneling Diode, Physical Review B 67, 12509 (2003).
Wendt et al., Electronic and Vibrational Properties of Ultrathin SiO2 Films Grown on Mo(112), 2005, Phys. Rev. vol. B72, pp. 1150409-1-115409.0.
Yan et al., Magnesium Oxide as a Candidate High-k Gate Dielectric, 2006, Applied Physics Lett. vol. 88, pp. 142901-1-142901-3.
Yen et al., Reduction in Critical Current Density for Spin Torque Transfer Switching with Composite Free Layer, Applied Physics Letters 93, 092504 (2008).
Zheng et al., Low Switching Current Flux-Closed Magnetoresistive Random Access Memory, Journal of Applied Physics, May 15, 2003.
Zheng et al., Magnetic Random Access Memory (MRAM), Journal of Nanoscience and Nanotechnology, vol. 7, 117-137 (2007).
Zhuang et al., Tech Dig. IEDM (2002) 193.

* cited by examiner

MEMORY CELL WITH RADIAL BARRIER

BACKGROUND

Spin torque transfer technology, also referred to as spin transfer or spin torque, combines semiconductor technology and magnetics, and is a more recent development. In spin torque transfer, the spin of electrons, rather than the charge, is used to indicate the presence of digital information. The digital information or data, represented as a "0" or "1", is storable in the alignment of magnetic moments within a magnetic element. The resistance of the magnetic element depends on the moment's alignment or orientation. The stored state is read from the element by detecting the component's resistive state.

The magnetic element, in general, includes a ferromagnetic pinned layer and a ferromagnetic free layer, each having a magnetization orientation, and a non-magnetic barrier layer therebetween. Any of these layers may be multi-layers. The magnetization orientations of the free layer and the pinned layer define the resistance of the overall magnetic element. Such an element is generally referred to as a "spin tunneling junction," "magnetic tunnel junction", "magnetic tunnel junction cell", and the like. When the magnetization orientations of the free layer and pinned layer are parallel, the resistance of the element is low. When the magnetization orientations of the free layer and the pinned layer are antiparallel, the resistance of the element is high.

At least because of their small size, it is desirous to use magnetic tunnel junction cell elements in many applications, such as magnetic hard disk drive read heads, magnetic sensors, and non-volatile random access memory. Improvements and developments in magnetic tunnel junction cells and their manufacture are always desired.

BRIEF SUMMARY

The present disclosure relates to magnetic tunnel junction cells and methods of making magnetic tunnel junction cells. The magnetic tunnel junction cells of this disclosure include a radially protective layer extending proximate at least the ferromagnetic free layer of the cell. The radially protective layer can be specifically chosen in thickness, deposition method, material composition, and/or extent along the cell layers to enhance the effective magnetic properties of the free layer, including the effective coercivity, effective magnetic anisotropy, effective dispersion in magnetic moment, or effective spin polarization.

In one particular embodiment, this disclosure is to a magnetic tunnel junction cell, the cell having a ferromagnetic free layer, a ferromagnetic pinned layer, and a barrier layer therebetween. A protective layer is radially around at least the free layer and an electrically insulating isolation layer is radially around at least the barrier layer. An insulating material is radially around all of the free layer, pinned layer, barrier layer, protective layer and isolation layer.

In another particular embodiment, this disclosure is to a magnetic tunnel junction cell having a ferromagnetic free layer, a ferromagnetic pinned layer, and a barrier layer therebetween. A protective layer is radially around at least the free layer, wherein the protective layer inhibits radial migration or diffusion of material into or from the free layer. An insulating material is radially around all of the free layer, pinned layer, barrier layer, and protective layer.

In yet another particular embodiment, this disclosure is to a method of making a magnetic tunnel cell, the method including providing a starting stack comprising, in order, a ferromagnetic pinned layer, a barrier layer, a ferromagnetic free layer, a metallic layer, and a mask layer. The method includes removing a portion of the mask layer to leave a patterned mask material, then removing a portion of the metallic layer and a portion of the free layer to leave a patterned metallic layer and a patterned free layer. After that, the method includes forming a radial protective layer around at least the free layer and removing a portion of the barrier layer leaving a patterned barrier layer. The method further includes forming a radial isolation layer around at least the patterned barrier layer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

This disclosure is directed to memory cells or any magnetic sensor having a tunneling barrier layer, and methods of making those cells or sensors. The devices (e.g., magnetic tunnel junction cells) of this disclosure include a radially protective layer extending proximate at least the ferromagnetic free layer of the cell. The devices may also include a radially isolating layer extending proximate the barrier layer of the cell. Either or both the protective layer and the radially isolating layer may inhibit alteration in the composition of the free layer (e.g., diffusion or migration of chemical species into or out of the free layer).

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to magnetic tunnel junction cells and methods of making magnetic tunnel junction cells. The magnetic tunnel junction cells of this disclosure include a radially protective layer extending proximate at least the ferromagnetic free layer of the cell. While the present disclosure is not so limited, an appreciation of various aspects of the disclosure will be gained through a discussion of the examples provided below.

Figure 1A:
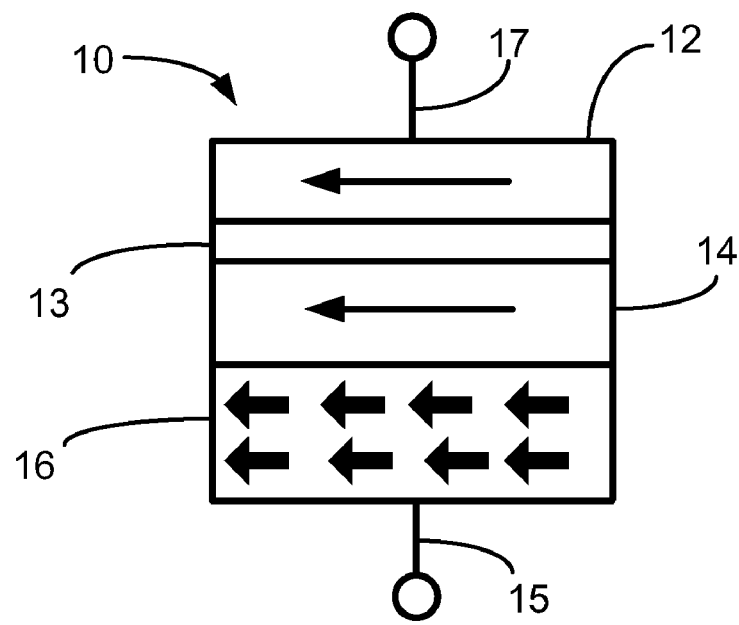
FIG. 1A is a cross-sectional schematic diagram of an illustrative magnetic tunnel junction cell in a low resistance state.
Figure 1B:
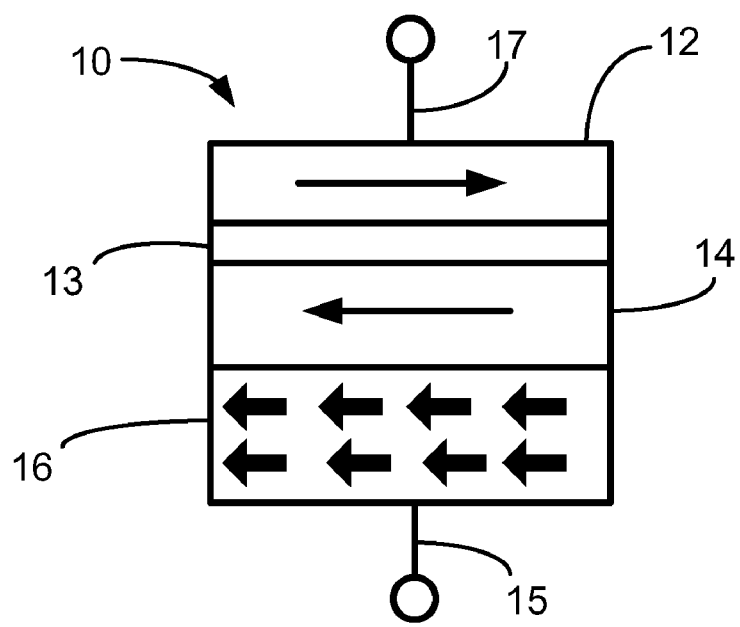
FIG. 1B is a cross-sectional schematic diagram of the magnetic tunnel junction cell in a high resistance state.

FIGS. 1A and 1B are a cross-sectional schematic diagram of a generic magnetic tunnel junction cell 10; in FIG. 1A, cell 10 is in the low resistance state, with the magnetization orientations parallel and in FIG. 1B, cell 10 is in the high resistance state, with the magnetization orientations anti-parallel.

Magnetic tunnel junction cell 10 includes a ferromagnetic free layer 12 and a ferromagnetic reference (i.e., pinned) layer 14. An antiferromagnetic pinning layer 16 is proximate pinned layer 14. Ferromagnetic free layer 12 and ferromagnetic pinned layer 14 are separated by an oxide barrier layer 13 or non-magnetic tunnel barrier. Ferromagnetic layers 12, 14 may be made of any useful ferromagnetic (FM) material such as, for example, Fe, Co or Ni and alloys thereof, such as NiFe and CoFe. Ternary alloys, such as CoFeB, may be particularly useful because of their lower moment and high polarization ratio, which are desirable for the spin-current switch. Either or both of free layer 12 and pinned layer 14 may be either a single layer or multi-layer, such as a synthetic antiferromagnetic (SAF) coupled structure, i.e., two ferromagnetic sublayers separated by a metallic spacer, such as Ru or Cu, with the magnetization orientations of the sublayers in opposite directions to provide either a balanced or unbalanced magnetization. Pinning layer 16 may be an antiferromagnetically ordered material (AFM) such as PtMn, IrMn, and others. Barrier layer 13 may be made of an electrically insulating material such as, for example an oxide material (e.g., $Al_2O_3$, $TiO_x$, MgO, ZnO, HfO, GaO, and various combinations thereof). Other suitable materials may also be used. Barrier layer 13 could optionally be patterned with free layer 12 or with pinned layer 14, depending on process feasibility and device reliability.

A first electrode 15 is in electrical contact with ferromagnetic pinned layer 14 via pinning layer 16 and a second electrode 17 is in electrical contact with ferromagnetic free layer 12. Other layers, such as seed layers may be present. Electrodes 15, 17, made from an electrically conducting material, usually metal (e.g., Cu, Ti, TiN, Ta, TaN, W), electrically connect ferromagnetic layers 12, 14 to a control circuit providing read and write currents through layers 12, 14. The resistance across magnetic tunnel junction cell 10 is determined by the relative orientation of the magnetization vectors or magnetization orientations of ferromagnetic layers 12, 14. The magnetization direction of ferromagnetic pinned layer 14 is pinned in a predetermined direction by pinning layer 16 while the magnetization direction of ferromagnetic free layer 12 is free to rotate under the influence of the spin torque effect. FIG. 1A illustrates magnetic tunnel junction cell 10 in the low resistance state where the magnetization orientation of ferromagnetic free layer 12 is parallel and in the same direction of the magnetization orientation of ferromagnetic pinned layer 14. This is generally termed the low resistance state or "0" data state. FIG. 1B illustrates magnetic tunnel junction cell 10 in the high resistance state where the magnetization orientation of ferromagnetic free layer 12 is anti-parallel and in the opposite direction of the magnetization orientation of ferromagnetic pinned layer 14. This is generally termed the high resistance state or "1" data state.

Switching the resistance state and hence the data state of magnetic tunnel junction cell 10 via spin-transfer occurs when a current, passing through a magnetic layer of magnetic tunnel junction cell 10, becomes spin polarized and imparts a spin torque on free layer 12 of magnetic tunnel junction cell 10. When a sufficient spin torque is applied to free layer 12, the magnetization orientation of free layer 12 can be switched between two opposite directions and accordingly, magnetic tunnel junction cell 10 can be switched between the parallel state (i.e., low resistance state or "0" data state) and anti-parallel state (i.e., high resistance state or "1" data state).

The illustrative spin-transfer torque magnetic tunnel junction cell 10 may be used to construct a memory device where a data bit is stored in the magnetic tunnel junction cell by changing the relative magnetization state of free layer 12 with respect to pinned layer 14. The stored data bit can be read out by measuring the resistance of cell 10 which changes with the magnetization direction of free layer 12 relative to pinned layer 14. In order for the spin-transfer torque magnetic tunnel junction cell 10 to have the characteristics of a non-volatile random access memory, free layer 12 exhibits thermal stability against random fluctuations so that the orientation of free layer 12 is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Methods of making magnetic tunnel junction cells according to this disclosure are illustrated stepwise in FIGS. 2-12. Overall, the magnetic tunnel junction cells of this disclosure may be made by well-known thin film techniques such as chemical vapor deposition (CVD), physical vapor deposition (PVD), atomic layer deposition (ALD), photolithography, or other thin film deposition techniques, and by wet or dry etching, ion milling, reactive ion etching (a form of dry etching), or other thin film removal techniques. The methods of this disclosure, with the specific series and sequences of steps, produce magnetic tunnel junction cells with desirable characteristics and properties.

Figure 2:
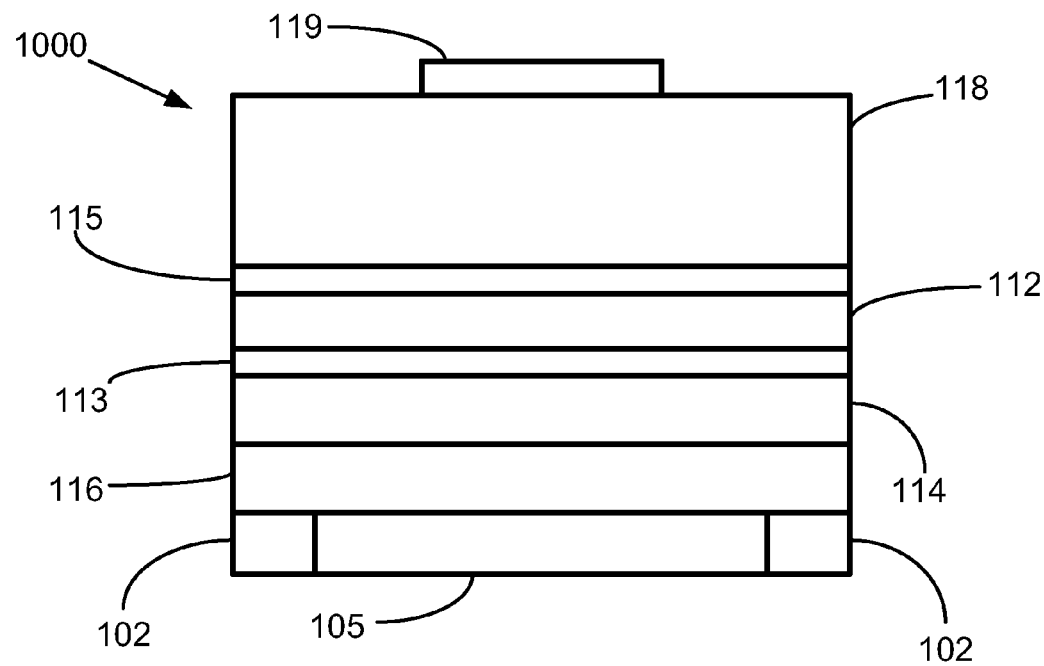
FIG. 2 is a schematic cross-sectional schematic of an element from a first step of manufacturing a magnetic tunnel junction cell.

In FIG. 2, a starting stack 1000 is illustrated. Starting stack 1000 includes a plurality of layers that have been formed (e.g., deposited) by known thin film techniques on a substrate. Starting stack 1000 includes a metal layer 105 that will be an electrode in the final magnetic tunnel junction cell, an antiferromagnetic (AFM) material 116 that will be a pinning layer in the final magnetic tunnel junction cell, a ferromagnetic (FM) material 114 that will be a pinned layer in the final magnetic tunnel junction cell, and a ferromagnetic (FM) material 112 that will be a free layer in the final magnetic tunnel junction cell. Seed and/or capping layers may also be present. Either or both of FM material 112 and FM material 114 are usually less than about 6 nm thick, for example, about 2-3 nm, although they may be thinner or thicker. AFM material 116 is usually about 5-20 nm thick. Between FM material 112 and FM material 114 is a barrier material 113 that will be a tunnel barrier layer in the final magnetic tunnel junction cell. Barrier material 113 is usually less than about 10 Angstroms thick and examples of suitable materials include non-electrically-conducting materials such as oxides.

Stack 1000 also includes a hard mask material 118 and an etch stop 115 between hard mask 118 and FM material 112. Examples of hard mask materials include metallic materials (e.g., Ta, W, Ti, TaN, TiN) and non-metallic materials (e.g., C). Hard mask material 118 is generally about 40-200 nm thick, depending on its material; for example, a metallic hard mask material (e.g., Ta, TaN, Ti, TiN) is about 200 nm thick, whereas a hard mask material comprising C is less than about 100 nm thick, for example, about 40 nm thick. Etch stop 115 provides a barrier to inhibit inadvertent removal of FM material 112 during removal of hard mask material 118, as will be discussed below. Etch stop 115 may be electrically conductive; examples of materials for etch stop 115 include Ru, Ti, W, and Ta metals and materials such as TiN, TaN. Present over hard mask material 118 is a photo resist layer 119. Photo resist layer 119 has a shape and size (e.g., width) approximate with the shape and size of the final magnetic tunnel junction cell. In this embodiment, metal layer 105 is not a large (e.g., wide) as the other layers. Insulating material 102, such as $SiO_2$, is positioned to fill in the volume between the substrate and AFM material 116.

Figure 3:
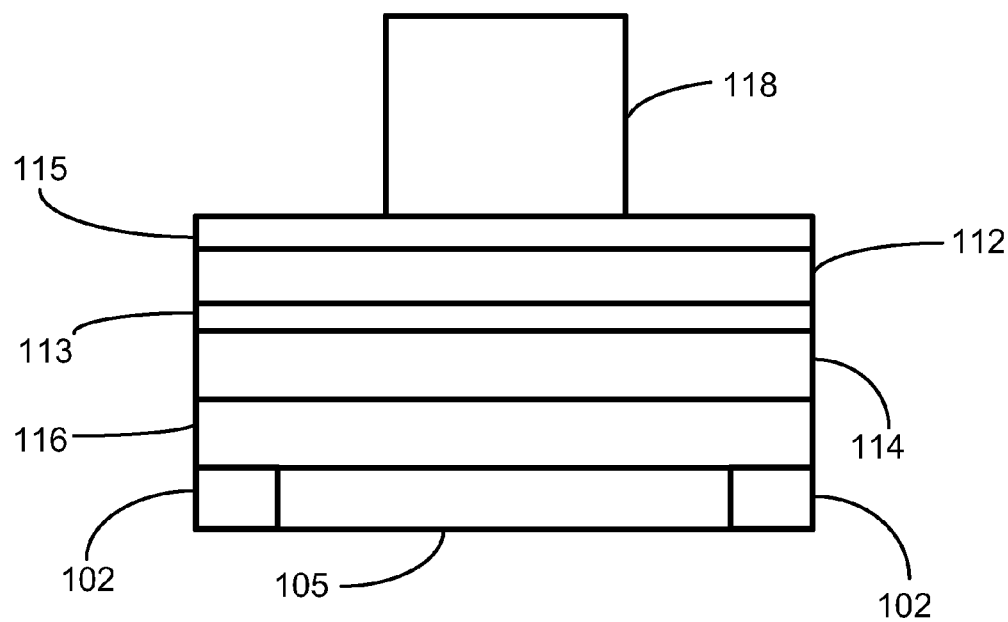
FIG. 3 is a schematic cross-sectional schematic of an element from a second step of manufacturing the magnetic tunnel junction cell.

In FIG. 3, hard mask material 118 not covered by photo resist 119 is removed, for example, by etching. Etch stop 115 provides a barrier to inhibit inadvertent removal of FM material 112 during removal of hard mask material 118. Etch stop 115 is deposited or otherwise applied to FM material 112 and is specifically chosen in thickness, deposition method, and material composition to provide mechanical and chemical protection to FM material 112 in later steps. In particular, etch stop 115 provides protection from energetic ions, radicals, or chemical species which might change the magnetic or electrical properties of FM material 112, or cause chemical corrosion thereto. After the desired removal of hard mask 118, photo resist 119 can be removed by conventional processes.

Figure 4A:
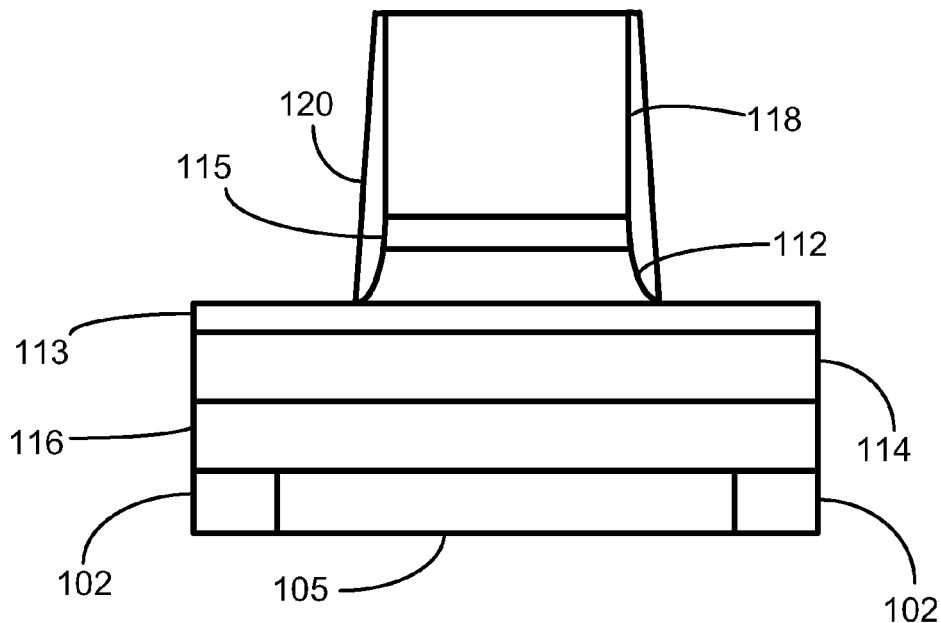
FIG. 4A is a schematic cross-sectional schematic of an element from a third step of manufacturing the magnetic tunnel junction cell.

In FIG. 4A, FM material 112 and etch stop 115 not covered by the patterned hard mask material 118 is removed, for example, by reactive ion etching or by ion milling. Barrier material 113 is at least essentially undisturbed. In some embodiments, as in FIG. 4B, some FM material 112 may re-deposit itself on the edges of FM material 112 and optionally on etch stop 115 and hard mask material 118, forming an annular layer around FM material 112, optionally etch stop 115 and optionally hard mask material 118.

Figure 4B:
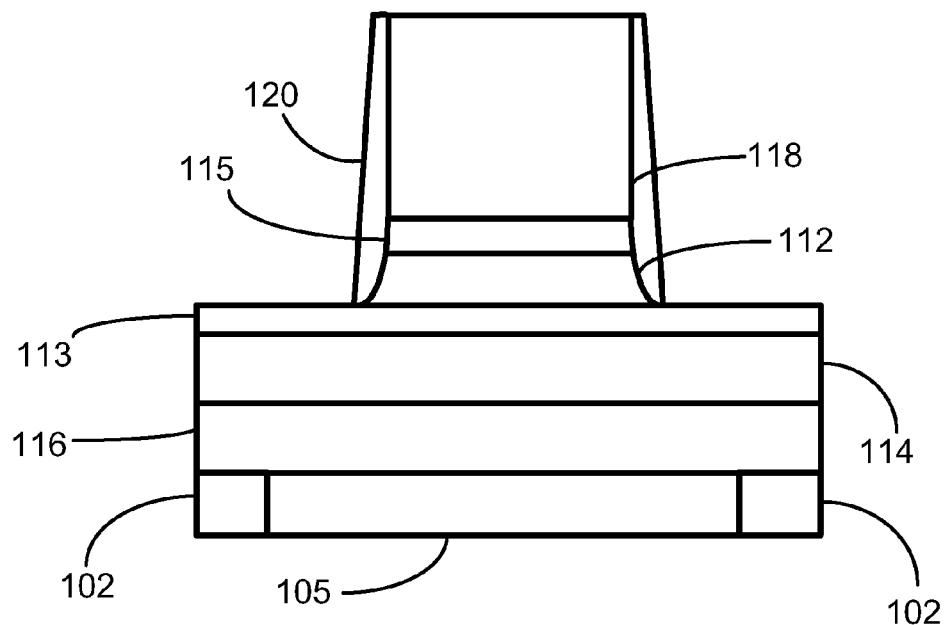
FIG. 4B is a schematic cross-sectional schematic of an alternate element from the third step of manufacturing the magnetic tunnel junction cell

Also in FIG. 4A and in FIG. 4B is illustrated a protective layer 120 radially surrounding FM material 112, etch stop 115 and hard mask material 118 and external to the annular layer of FM material 112, if present (as in FIG. 4B). Protective layer 120 extends at least the height of FM material 112, and possibly higher along etch stop 115, hard mask layer 118, and any additional layers above FM material 112. Protective layer 120 may be applied (e.g., deposited) by conventional techniques or may be a reaction product from the FM material removal process. Protective layer 120 may have a constant thickness (as illustrated in FIG. 4B) or a varying thickness (as illustrated in FIG. 4A). Examples of suitable materials for protective layer 120 include $Si_3N_4$, $SiO_2$, $SiO_xN_y$, AlN, MgO, $Al_2O_3$, $Ta_2O_5$, Ta, Ru, W, TiW, TaN, TiN, low K materials, and various combinations thereof. The specific configuration of protective layer 120 (i.e., thickness, deposition method, material composition, and extent or height along FM material 112 and upper layers, etc.) is selected to provide mechanical and chemical protection for FM material 112 from subsequent processing. In particular, protective layer 120 provides protection to FM material 112 from energetic ions, radicals, or chemical species which might change the magnetic or electrical properties of the free layer, or cause chemical corrosion. For example, protective layer 120 inhibits radial migration and/or diffusion of material into or out from FM material 112, as either or all of molecules, atoms or ions of FM material 112. Additionally, protective layer 120 may inhibit radial migration and/or diffusion of material into or out from barrier material 113. Atoms, molecules and ions that might migrate or diffuse out from FM material 112 or barrier material 113 include any or all of Mn, O, B, Mg, $N_2$ and $H_2O$.

Additionally, the specific configuration of protective layer 120 (i.e., thickness, deposition method, material composition, and extent or height along FM material 112 and upper layers, etc.) is selected to enhance the effective magnetic properties of the resulting free layer in the resulting magnetic tunnel junction cell, including the effective coercivity, effective magnetic anisotropy, effective dispersion in magnetic moment, or effective spin polarization of the free layer. The magnetic anisotropy may be affected as a result of either material or stress properties. Due to the protection this protective layer 120 provides, this layer allows for self aligned removal of the remaining layers of the sensor stack, which in turn allows for dense patterning. In addition, by the thickness of protective layer 120, the size of FM material 114 relative to FM material 112 can be intentionally regulated.

Figure 5:
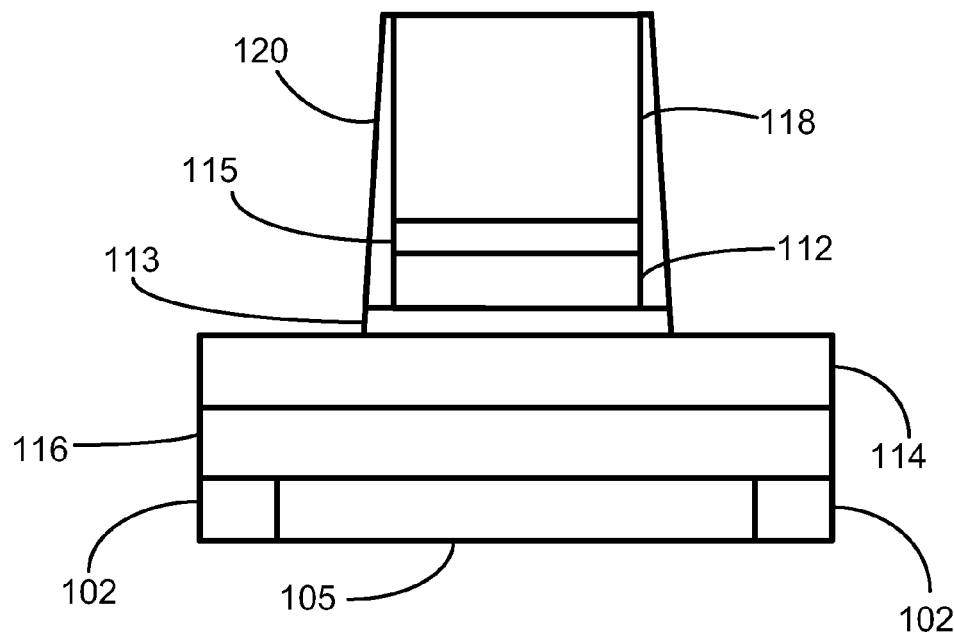
FIG. 5 is a schematic cross-sectional schematic of an element from a fourth step of manufacturing the magnetic tunnel junction cell.

In FIG. 5, the portion of barrier material 113 not covered by FM material 112 is removed, for example, by reactive ion etching or by ion milling. FM material 112 and the upper layers act as a patterning mask. In some embodiments, barrier material 113 has an undercut portion. FM material 114, below barrier material 113, is at least essentially undisturbed.

Figure 6:
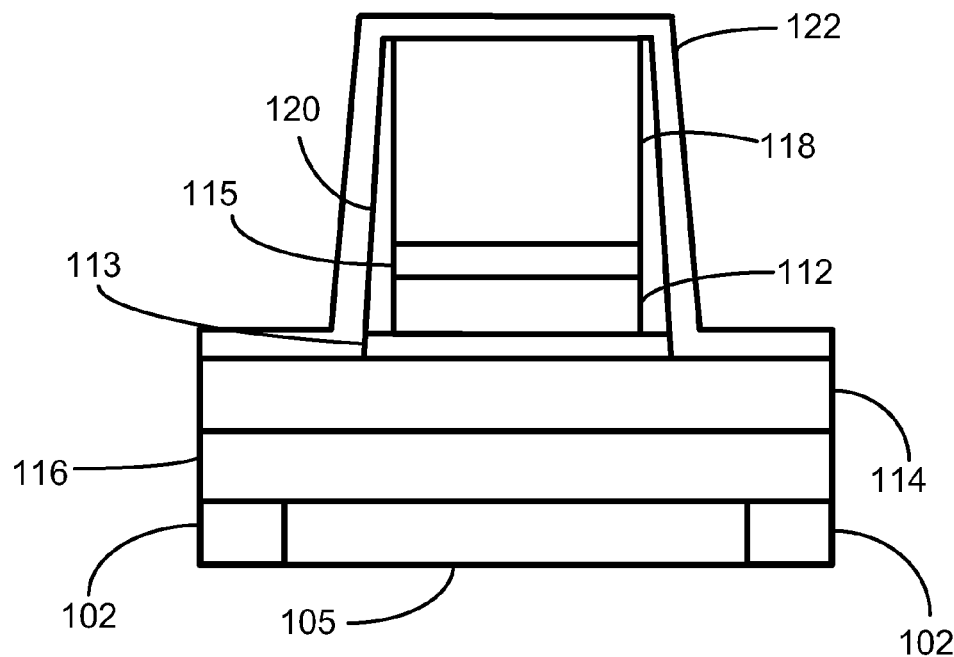
FIG. 6 is a schematic cross-sectional schematic of an element from a fifth step of manufacturing the magnetic tunnel junction cell.

In FIG. 6, an isolation layer 122 is applied over FM material 114, barrier material 113, and at least partially over protective layer 120 and subsequent layers. Isolation layer 122 extends across tunneling barrier material 113 at a minimum, and possibly higher along the patterned feature including (in this example of FIG. 5) FM material 112, hard mask material 118 and any additional stack layers. Isolation layer 122 preferably fills in any undercut portion of barrier layer 113 that may exist. Isolation layer 122 has a thickness of about 2-30 nm and is formed of electrically insulating materials such as oxide(s), nitride(s), and/or oxide(s) or nitride(s) of the material of FM material 112, 114 or AFM material 116. Examples of suitable materials for isolation layer 122 include $Si_3N_4$, $SiO_2$, $SiO_xN_y$, SiOCN, $Ta_2O_5$, $Al_2O_3$, MgO, and other low K dielectrics, with $Ta_2O_5$, $Al_2O_3$, MgO being preferred materials.

The properties of isolation layer 122 (i.e., thickness, deposition method, material composition, and extent along the device edge, etc.) are selected to provide mechanical and chemical protection to barrier material 113 from subsequent processing. In particular, isolation layer 122 provides protection in the resulting magnetic tunnel junction cell for the barrier layer from energetic ions or chemical species which might cause preferential electrical breakdown or shunting of current along the barrier edges, or chemical corrosion. Due to the protection isolation layer 122 provides to barrier material 113, this layer allows for self aligned removal of the remaining layers (e.g., FM material 114, AFM material 116, etc.) of the stack, which in turn allows for a dense patterning of multiple stacks. Specifically, in the resulting magnetic tunnel junction cell, isolation layer 122 inhibits and preferably prevents the conduction of current from bottom electrode (e.g., electrode 15 of magnetic tunnel junction cell 10) to the top electrode (e.g., electrode 17 of magnetic tunnel junction cell 10).

Figure 7:
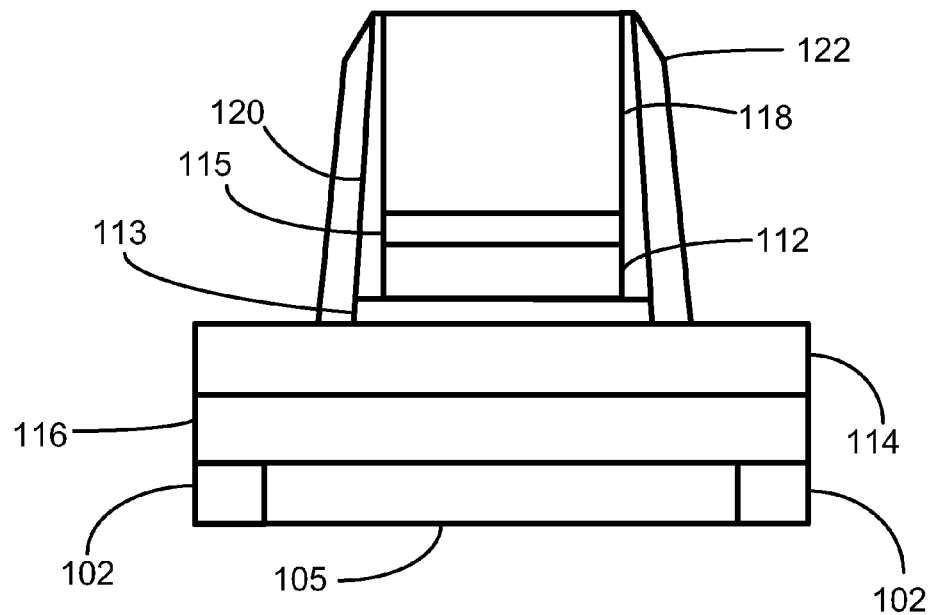
FIG. 7 is a schematic cross-sectional schematic of an element from a sixth step of manufacturing the magnetic tunnel junction cell.

In FIG. 7, a portion of isolation layer 122 is removed; typically, the portion removed is over FM material 116 and over hard mask material 118. Isolation layer 122 may be removed by anisotropic etching, to remove the horizontal portions (i.e., the portions generally perpendicular to the substrate on which the stack resides) of isolation layer 122. In FIG. 7, isolation layer 122 is illustrated as having facets, which is a common product of anisotropic etching.

Figure 8:
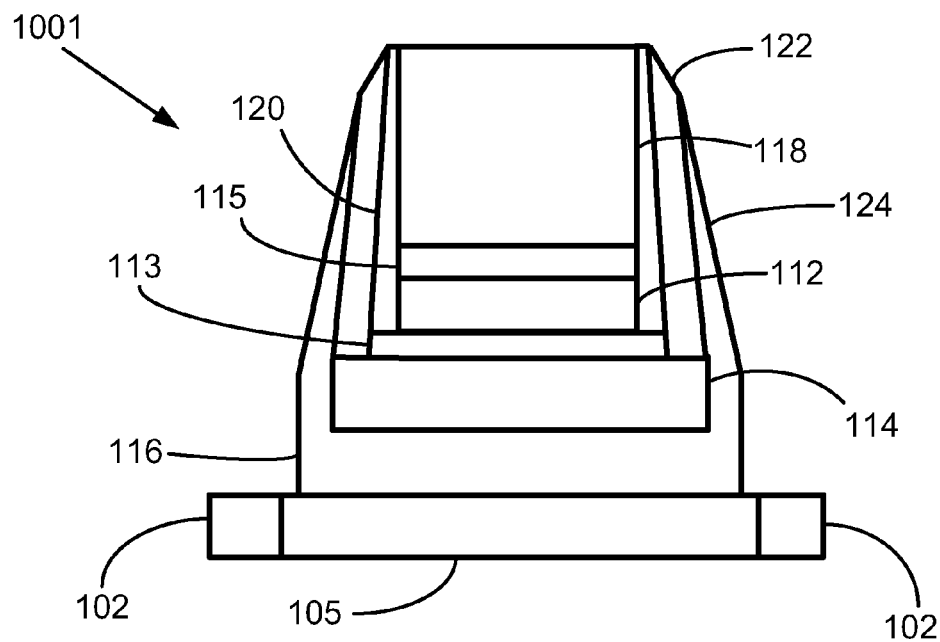
FIG. 8 is a schematic cross-sectional schematic of an element from a seventh step of manufacturing the magnetic tunnel junction cell.

In FIG. 8, the portion of FM material 114 and AFM material 116 not masked by isolation layer 122 is removed, for example, by reactive ion etching or by ion milling. In some embodiments, some AFM material 116 may re-deposit itself on the edges of FM material 114 and isolation layer 122, due to the material removal process, forming an annular layer indicated as radial layer 124. This re-deposited AFM material, if present, is usually less than about 20 nm thick, in some embodiments, and about 3-6 nm thick. It may be desirable to oxidize the re-deposited radial layer 124 to provide a non-conductive material. Alternately, annular layer 124 may be a reaction product from the FM material and AFM material removal process, and may include oxide(s), carbide(s) and/or nitride(s) of those materials. The resulting structure, indicated as stack 1001, includes the functional layers configured ready for use as a magnetic tunnel junction cell.

Figure 9:
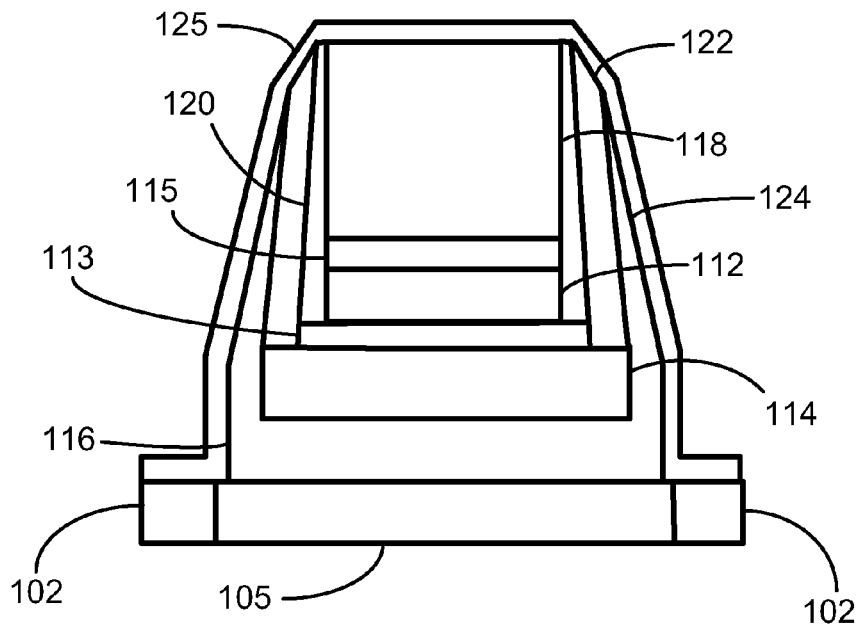
FIG. 9 is a schematic cross-sectional schematic of an eighth step of manufacturing the magnetic tunnel junction cell.
Figure 10:
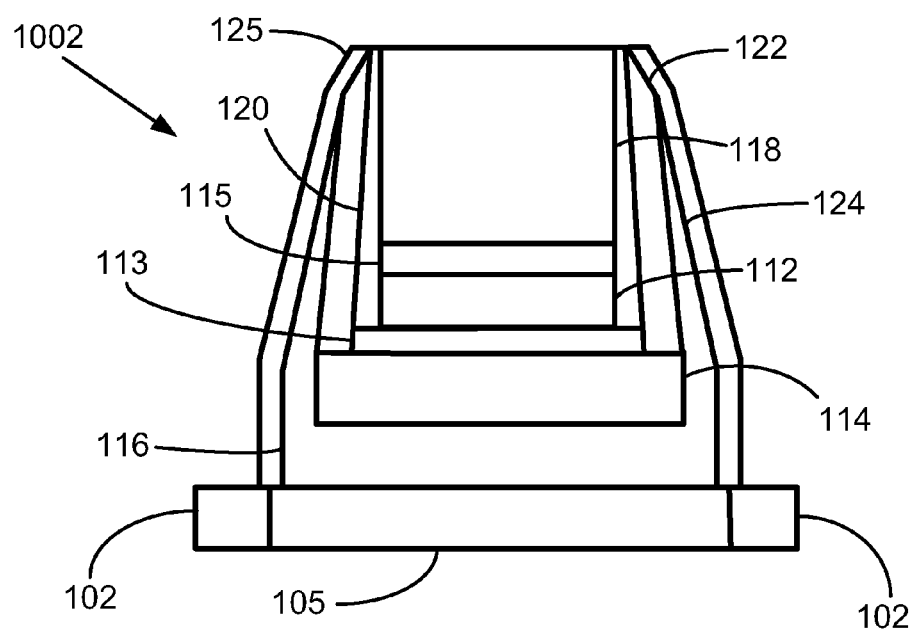
FIG. 10 is a schematic cross-sectional schematic of an element from a ninth step of manufacturing the magnetic tunnel junction cell.

In FIG. 9, a barrier layer 125 is applied over stack 1001. This spacer or barrier layer 125 provides a non-porous barrier around stack 1001 and its various layers. Horizontally located barrier layer material can be removed (e.g., etched); FIG. 10. The resulting structure is indicated as stack 1002.

Figure 11:
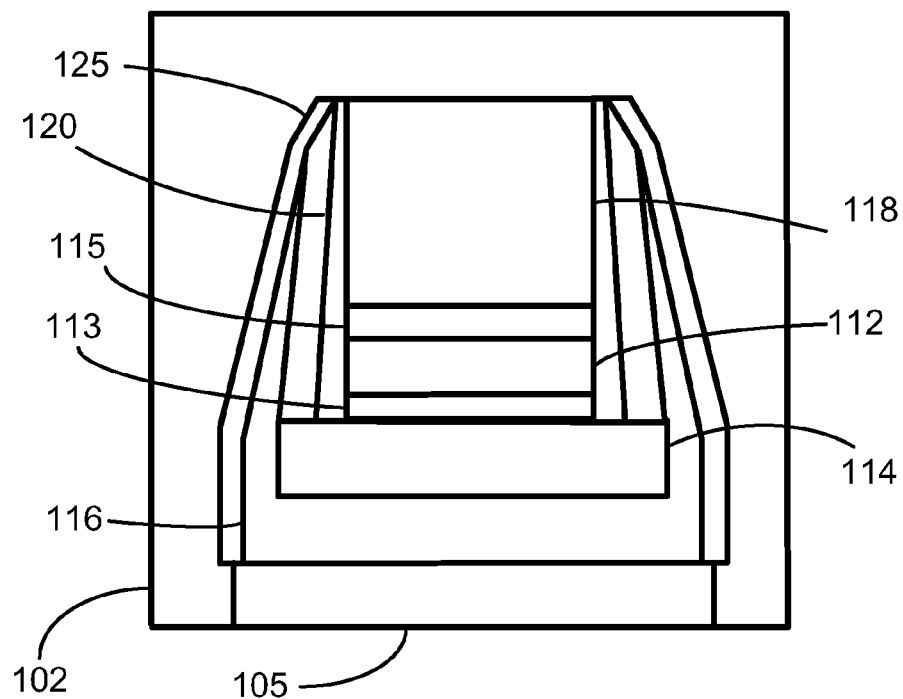
FIG. 11 is a schematic cross-sectional schematic of an element from a tenth step of manufacturing the magnetic tunnel junction cell.
Figure 12:
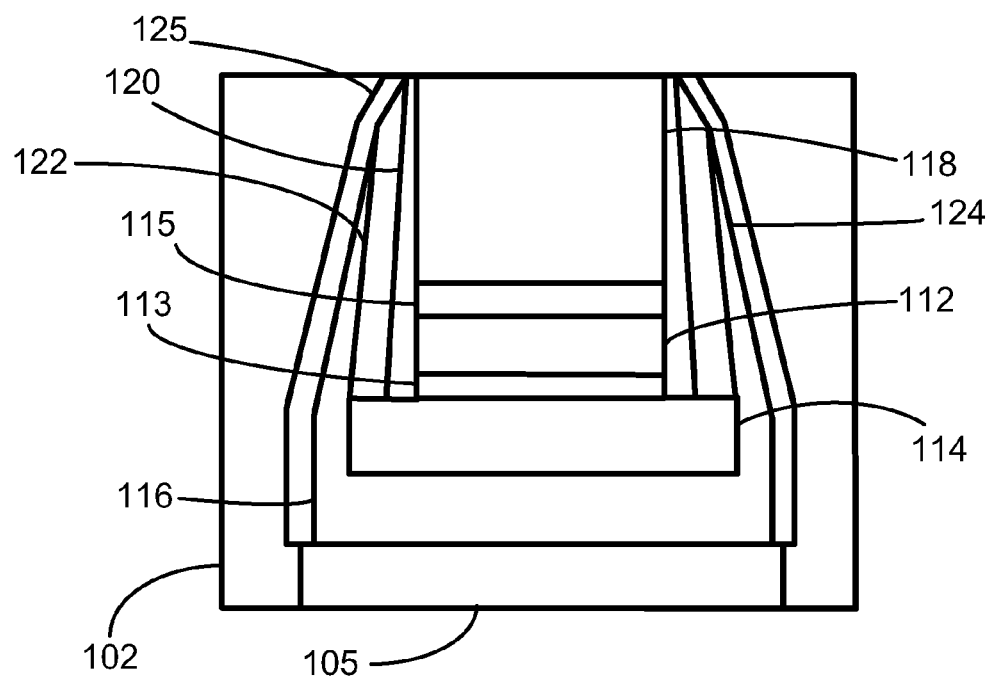
FIG. 12 is a schematic cross-sectional schematic of an element from an eleventh step of manufacturing the magnetic tunnel junction cell.

FIGS. 11 and 12 illustrate encasing stack 1002 in electrically insulating material 102 (FIG. 11) and then removing a portion of that insulating material 102 to be flush with hard mask material 118 (FIG. 12).

Figure 13:
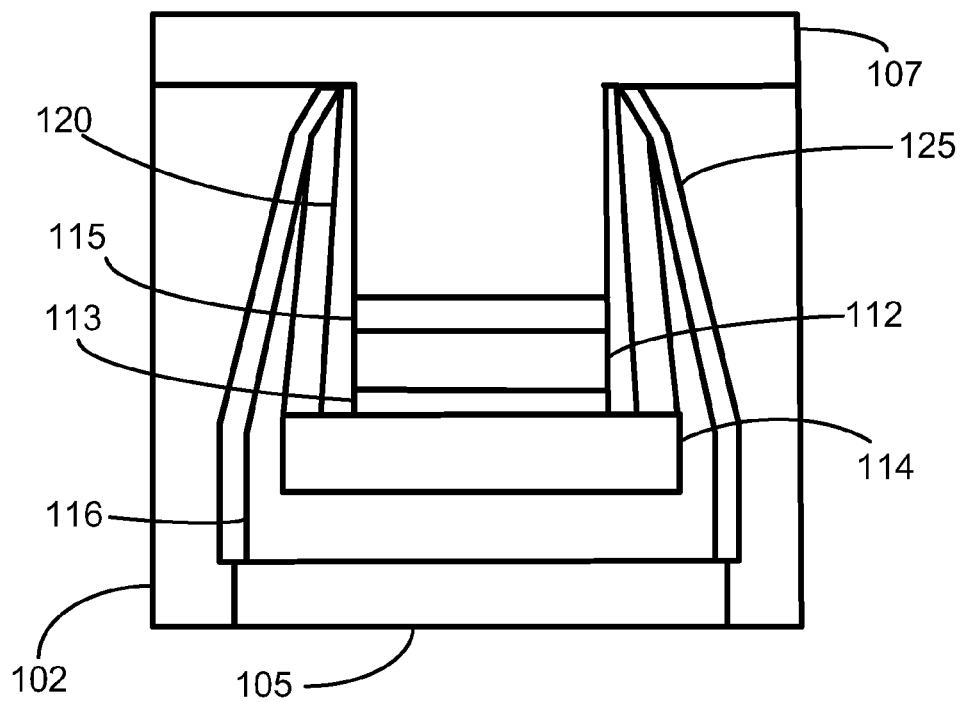
FIG. 13 is a schematic cross-sectional schematic of an element from an twelfth step of manufacturing the magnetic tunnel junction cell.
Figure 14:
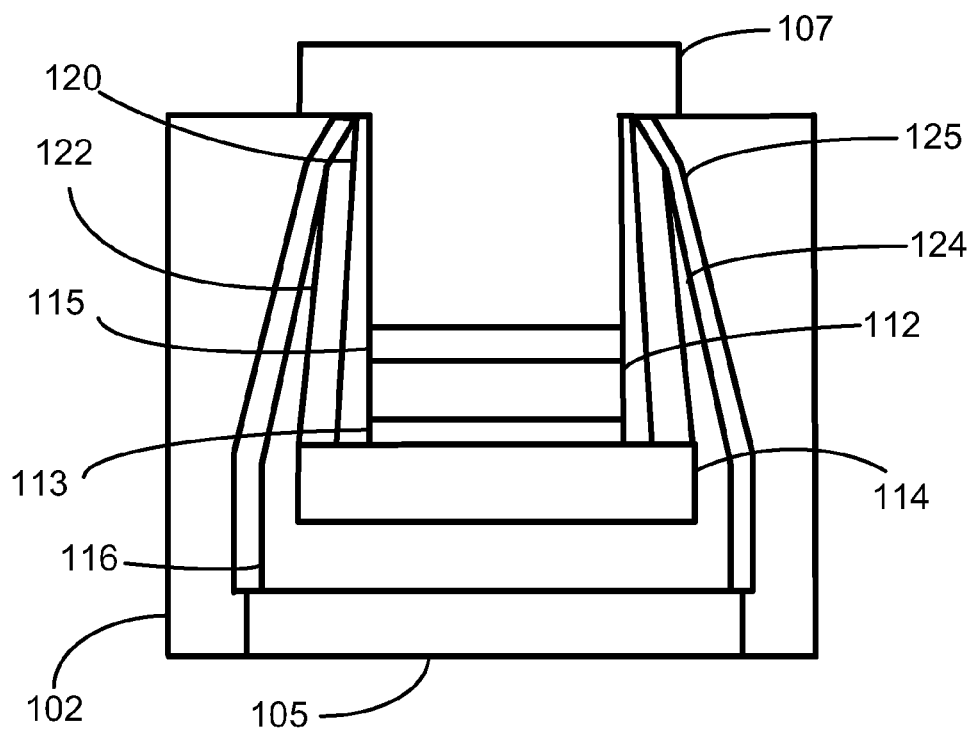
FIG. 14 is a schematic cross-sectional schematic of an element from an thirteenth step of manufacturing the magnetic tunnel junction cell.
Figure 15:
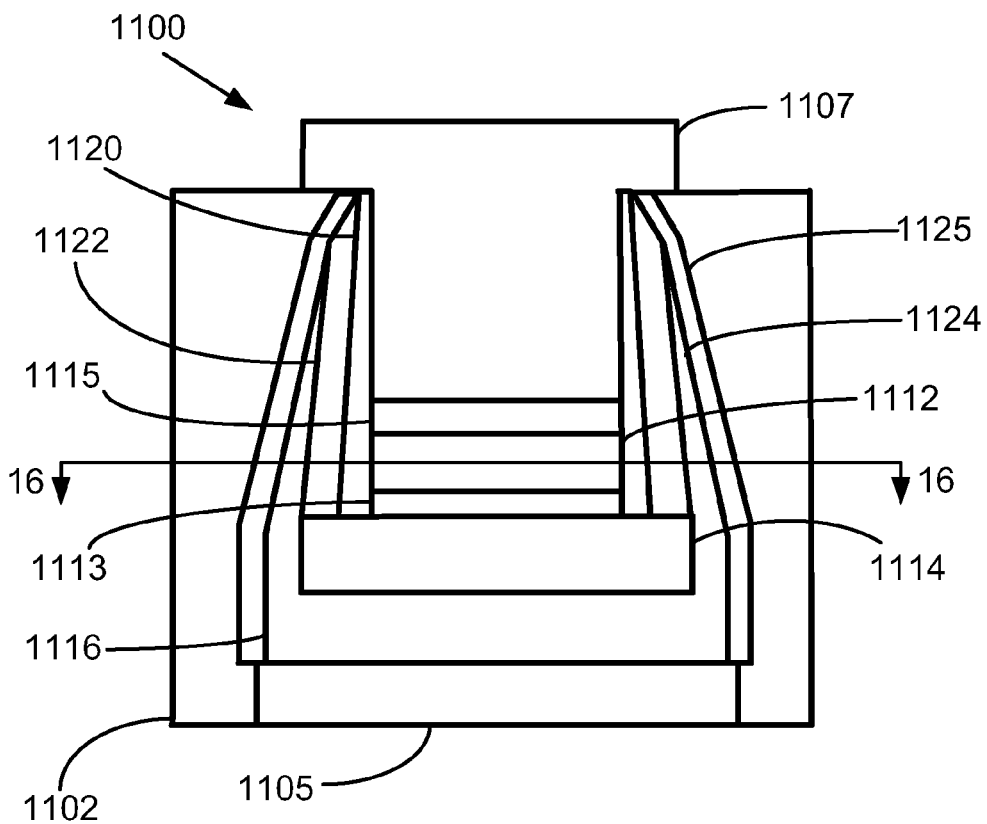
FIG. 15 is a schematic side view of the resulting magnetic tunnel junction cell of the previous steps.
Figure 16:
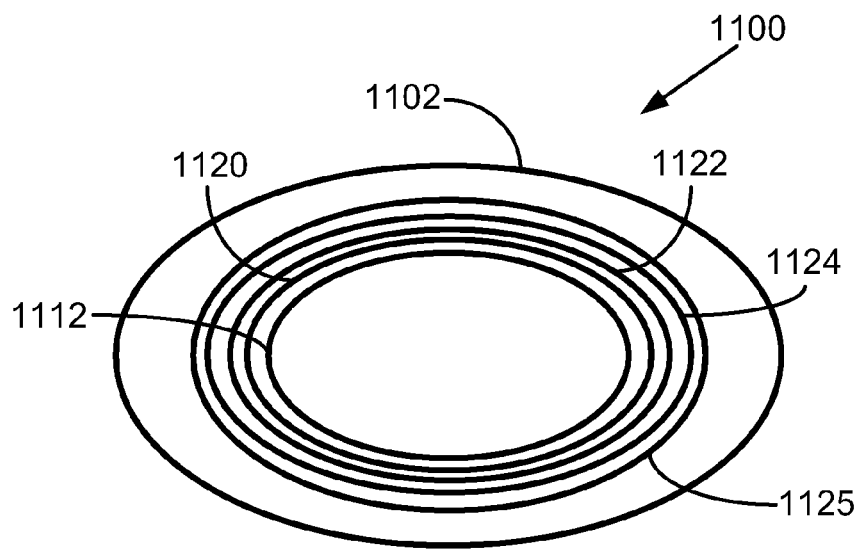
FIG. 16 is a schematic cross-sectional view of the magnetic tunnel junction cell taken along line 16-16 of FIG. 15.

In FIG. 13, if hard mask material 118 is a non-conductive material, hard mask material 118 is eliminated and replaced with an electrically conductive material 107 (e.g., metal, such as Cu, W, Al, Ag and Au), which will be the electrode (e.g., electrode 17 of magnetic tunnel junction cell 10) for the resulting magnetic tunnel junction cell. Etch stop 115 provides mechanical and chemical protection to FM material 112 during this step of applying conductive material 107. However, if hard mask material 118 is conductive (e.g., metal), hard mask material 118 is maintained and conductive material 107 is posited over material 118. In FIG. 14, excess conductive material 107 is removed to obtain the desired shape of the resulting electrode. The resulting magnetic tunnel junction cell is illustrated in FIGS. 15 and 16 as cell 1100.

Magnetic tunnel junction cell 1100 includes a ferromagnetic (FM) free layer 1112 and a ferromagnetic (FM) reference (i.e., pinned) layer 1114. An antiferromagnetic (AFM) pinning layer 1116 is proximate FM pinned layer 1114. FM free layer 1112 and FM pinned layer 1114 are separated by a barrier layer 1113. FM layers 1112, 1114 may be made of any useful ferromagnetic (FM) material such as, for example, Fe, Co or Ni and alloys thereof, such as NiFe, CoFe and CoFeB. A first electrode 1105 is in electrical contact with FM pinned layer 1114 via AFM layer 1116 and a second electrode 1107 is in electrical contact with FM free layer 1112 via layer 115. Electrodes 1115, 1117 electrically connect ferromagnetic layers 1112, 1114 to a control circuit providing read and write currents through layers 1112, 1114.

Radially surrounding at least barrier layer 1113 is isolation layer 1122. Isolation layer 1122 provides protection for barrier layer 1113 from energetic ions or chemical species which might cause preferential electrical breakdown or shunting of current along the barrier edges, or chemical corrosion. Radially surrounding at least FM free layer 1112, positioned between isolation layer 1122 and FM free layer 1112, is protective layer 1120. Protective layer 1120 enhances the effective magnetic properties of FM free layer 1112, including the effective coercivity, effective magnetic anisotropy, effective dispersion in magnetic moment, or effective spin polarization of the free layer. In some embodiments, protective layer 1120 inhibits migration and/or diffusion of atoms, ions or molecules thereacross, for example, between FM free layer 1112 and isolation layer 1122. Radially surrounding protective layer 1120 and isolation layer 1122 is an annular layer 1124, usually made of a material from FM pinned layer 1114, AFM pinning layer 1116, their oxides and/or nitrides. By having annular layer 1124 external to isolation layer, isolation layer 1122 inhibits and preferably prevents the conduction of current from first electrode 1105 to second electrode 1107 through annual layer 1124, and thus inhibits and preferably prevents the bypass of FM free layer 1112. A view of these various annular layers is shown in FIG. 16, where FM free layer 1112 is seen encircled by protective layer 1120, isolation layer 1122, and annular layer 1124. Radially surrounding annular layer 1124 is non-porous barrier or spacer layer 1125. Although the various encircling layers in FIG. 16 are illustrated as having a varying thickness around FM free layer 1112, in some embodiments, the thickness of each layer will be constant as it encircles FM free layer 1112 and any intermediate layer.

Thus, embodiments of the MEMORY CELL WITH RADIAL BARRIER are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A magnetic tunnel junction cell comprising:
   a ferromagnetic free layer, a ferromagnetic pinned layer, and a barrier layer therebetween;
   a protective layer comprising $Si_3N_4$, $SiO_2$, $SiO_xN_y$, AlN, MgO, $Al_2O_3$, $Ta_2O_5$, Ta, Ru, W, TiW, TaN or TiN, said protective layer being radially around at least the free layer;
   an electrically insulating isolation layer radially around at least the barrier layer and partially around the protective layer, the electrically insulating isolation layer having a thickness from about 2 nm to 30 nm; and
   insulating material radially around all of the free layer, pinned layer, barrier layer, protective layer and isolation layer.

2. The magnetic tunnel junction cell of claim 1 wherein the isolation layer comprises $Si_3N_4$, $SiO_2$, $SiO_xN_y$, SiOCN, $Ta_2O_5$, $Al_2O_3$ or MgO.

3. The magnetic tunnel junction cell of claim 1 wherein the isolation layer is radially around the barrier layer and the free layer.

4. The magnetic tunnel junction cell of claim 3 wherein the isolation layer is radially around the barrier layer, the free layer, and at least a portion of the protective layer.

5. The magnetic tunnel junction cell of claim 1 further comprising an annular layer between the isolation layer and the insulating material, wherein the annular layer comprises an antiferromanetically ordered material, oxide thereof or nitride thereof.

6. The magnetic tunnel junction of claim 5 further comprising a pinning layer proximate the pinned layer, the pinning layer comprising an antiferromagnetically ordered material, and the annular layer comprising the antiferromagnetically ordered material, oxide thereof or nitride thereof.

7. The magnetic tunnel junction of claim 1 further comprising an etch stop layer proximate the free layer opposite the barrier layer.

8. The magnetic tunnel junction of claim 1 wherein the protective layer inhibits radial migration of material from the free layer.

9. The magnetic tunnel junction cell of claim 8 wherein the protective layer inhibits radial migration or diffusion of any of Mn, O, B, Mg, $N_2$ and $H_2O$ material into and out from the free layer.

10. A magnetic tunnel junction cell comprising:
    a ferromagnetic free layer, a ferromagnetic pinned layer, and a barrier layer therebetween;
    a protective layer comprising $Si_3N_4$, $SiO_2$, $SiO_xN_y$, AlN, MgO, $Al_2O_3$, $Ta_2O_5$, Ta, Ru, W, TiW, TaN or TiN, said protective layer being radially around at least the free layer, wherein the protective layer inhibits radial migration or diffusion of material into and out from the free layer;
    an isolation layer radially surrounding at least the barrier layer and partially around the protective layer, the isolation layer having a thickness from about 2 nm to 30 nm;
    an annular layer radially surrounding the protective layer and the isolation layer; and
    insulating material radially surrounding the annular layer.

11. The magnetic tunnel junction cell of claim 10 wherein the protective layer inhibits radial migration or diffusion of any of Mn, O, B, Mg, $N_2$ and $H_2O$ material into and out from the free layer.

12. The magnetic tunnel junction cell of claim 10 wherein the annular layer comprises antiferromagnetic material, ferromagnetic material, or oxides, carbides, or nitrides thereof.

13. A method of making a magnetic tunnel junction cell, comprising:
    providing a starting stack comprising, in order, a ferromagnetic pinned layer, a barrier layer, a ferromagnetic free layer, an etch stop layer, and a mask layer;
    removing a portion of the mask layer leaving a patterned mask material;
    removing a portion of the etch stop layer and a portion of the free layer, leaving a patterned etch stop layer and a patterned free layer;
    forming a radial protective layer comprising $Si_3N_4$, $SiO_2$, $SiO_xN_y$, AlN, MgO, $Al_2O_3$, $Ta_2O_5$, Ta, Ru, W, TiW, TaN or TiN, said radial protective layer being around at least the free layer;
    removing a portion of the barrier layer leaving a patterned barrier layer;
    forming a radial isolation layer around at least the patterned barrier layer, the radial isolation layer having a thickness from about 2 nm to 30 nm;
    removing a portion of the pinned layer using the isolation layer has a mask, leaving a patterned pinned layer, and wherein said radial isolation layer is electrically insulating and is at least partially around said radial protective layer.

14. The method of claim 13 wherein forming a radial isolation layer around at least the patterned barrier layer comprises forming a radial isolation layer around at least the patterned barrier layer and at least a portion of the radial protective layer.

15. The method of claim 13 wherein forming a radial protective layer around at least the free layer comprises depositing a protective layer around at least the free layer.

16. The method of claim 13 wherein forming a radial protective layer around at least the free layer comprises forming a radial protective layer around the free layer and the etch stop layer.

17. The method of claim 13 further comprising encasing the patterned pinned layer, the isolation layer, the protective layer, the patterned barrier layer, the patterned free layer with an insulating material.

18. A magnetic sensor comprising:
    a ferromagnetic free layer, a ferromagnetic pinned layer, and a barrier layer therebetween;
    a protective layer comprising $Si_3N_4$, $SiO_2$, $SiO_xN_y$, AlN, MgO, $Al_2O_3$, $Ta_2O_5$, Ta, Ru, W, TiW, TaN or TiN, said protective layer being radially around at least the free layer;
    an electrically insulating isolation layer radially around at least the barrier layer and partially around the protective layer, the electrically insulating isolation layer having a thickness from about 2 nm to 30 nm; and
    insulating material radially around all of the free layer, pinned layer, barrier layer, protective layer and isolation layer.

19. The magnetic sensor of claim 18 wherein the isolation layer comprises $Si_3N_4$, $SiO_2$, $SiO_xN_y$, SiOCN, $Ta_2O_5$, $Al_2O_3$ or MgO.

20. The magnetic sensor of claim 18 wherein the isolation layer is radially around the barrier layer and the free layer.

21. The magnetic sensor of claim 20 wherein the isolation layer is radially around the barrier layer, the free layer, and at least a portion of the protective layer.

* * * * *